United States Patent
Ko

(10) Patent No.: US 7,253,030 B2
(45) Date of Patent: Aug. 7, 2007

(54) METHOD OF FABRICATING HIGH-VOLTAGE CMOS DEVICE

(75) Inventor: Kwang Young Ko, Kyunggido (KR)

(73) Assignee: Dongbu Electronics Co., Ltd, Seoul (KR)

( * ) Notice: Subject to any disclaimer, the term of this patent is extended or adjusted under 35 U.S.C. 154(b) by 187 days.

(21) Appl. No.: 11/022,847

(22) Filed: Dec. 28, 2004

(65) Prior Publication Data

US 2005/0142723 A1  Jun. 30, 2005

(30) Foreign Application Priority Data

Dec. 30, 2003  (KR) .................. 10-2003-0101010

(51) Int. Cl.
*H01L 21/332* (2006.01)
(52) U.S. Cl. ............... 438/135; 438/197; 438/303
(58) Field of Classification Search .......... 438/197, 438/199, 135, 303, 229, 299
See application file for complete search history.

(56) References Cited

U.S. PATENT DOCUMENTS 6,211,552 B1 * 4/2001 Efland et al. .............. 257/343
6,424,005 B1 * 7/2002 Tsai et al. ................. 257/335

* cited by examiner

*Primary Examiner*—Michael Trinh
(74) *Attorney, Agent, or Firm*—Finnegan, Henderson, Farabow, Garrett & Dunner, L.L.P.

(57) ABSTRACT

The present invention provides a method of fabricating a high-voltage CMOS device, in which an extended drain region failing to enclose a heavily-doped drain region is separated from a high current flow path to enable high electric field concentration and breakdown to occur within a bulk of a silicon substrate and by which device reliability can be enhanced. The present invention includes the steps of forming a pad oxide layer on a substrate, forming a heavily doped drain region, a heavily doped source region, a source region, and an extended drain region failing to enclose the heavily doped drain region by ion implantation using a pattern provided on the pad oxide layer, forming a field oxide layer on a prescribed area of the extended drain region, and forming a gate and a gate spacer over the substrate.

3 Claims, 2 Drawing Sheets

METHOD OF FABRICATING HIGH-VOLTAGE CMOS DEVICE

This application claims the benefit of the Korean Application No. P2003-0101010 filed on Dec. 30, 2003, which is hereby incorporated by reference.

BACKGROUND OF THE INVENTION

1. Field of the Invention

The present invention relates to a method of fabricating a high-voltage CMOS device, by which an extended drain region fails to enclose a heavily-doped drain region.

2. Discussion of the Related Art

Generally, a power MOSFET device has a switching speed superior to that of other power devices and is characterized in having low ON-resistance of a device having a relatively low strength voltage below 300V, and a high-voltage lateral power MOSFET becomes popular as a high-integration power device.

There are various high-voltage power devices such as DMOSFET (double-diffused MOSFET), insulated gate bipolar transistor, EDMOSFET (extended drain MOSFET), LDMOSFET (lateral double-diffused MOSFET), etc.

Specifically, LDMOSFET is variously applicable to HSD (high side driver), LSD (low side driver), H-bridge circuit, and the like and its fabrication is facilitated. Yet, in the LDMOSFET, a doping density of a channel region is structurally uneven to bring a high threshold voltage thereof and breakdown takes place on s silicon substrate surface of a drift region in the vicinity of the channel region.

FIG. 1 is a cross-sectional diagram of a high-voltage CMOS transistor according to a related art.

Referring to FIG. 1, a lightly-doped extended N type drain 12 is formed in a P type substrate 11. And, a highly doped N+ type drain is sufficiently distant from a source 14 to provide a high strength voltage even if a high voltage is applied to a drain 13.

However, a current flow path appears on a surface region of the above-configured high-voltage CMOS transistor. As the high voltage is applied to the drain, an electric field is focused on a surface junction 15 between the extended N type drain and the P type substrate. Hence, both of the high current migration and the electric field concentration take place simultaneously to degrade device reliability due to the corresponding colliding ionization. Moreover, breakdown occurs on a semiconductor surface to lower the device reliability as well.

SUMMARY OF THE INVENTION

Accordingly, the present invention is directed to a method of fabricating a high-voltage CMOS device that substantially obviates one or more problems due to limitations and disadvantages of the related art.

An object of the present invention is to provide a method of fabricating a high-voltage CMOS device, in which an extended drain region failing to enclose a heavily-doped drain region is separated from a high current flow path to enable high electric field concentration and breakdown to occur within a bulk of a silicon substrate and by which device reliability can be enhanced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a high-voltage CMOS device according to the present invention includes the steps of forming a pad oxide layer on a substrate, forming a heavily doped drain region, a heavily doped source region, a source region, and an extended drain region failing to enclose the heavily doped drain region by ion implantation using a pattern provided on the pad oxide layer, forming a field oxide layer on a prescribed area of the extended drain region, and forming a gate and a gate spacer over the substrate.

Preferably, if the substrate is a P type substrate, the heavily doped drain region, the heavily doped source region, and the extended drain region are doped with N type impurities and the source region is doped with P type impurities.

Preferably, if the substrate is an N type substrate, the heavily doped drain region, the heavily doped source region, and the extended drain region are doped with P type impurities and the source region is doped with N type impurities.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2D are cross-sectional diagrams for explaining a method of fabricating a high-voltage CMOS device according to the present invention.

Figure 1:
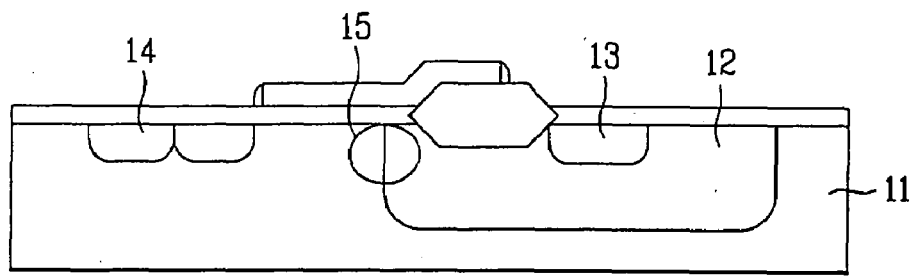
FIG. 1 is a cross-sectional diagram of a high-voltage CMOS according to a related art.
Figure 2A:
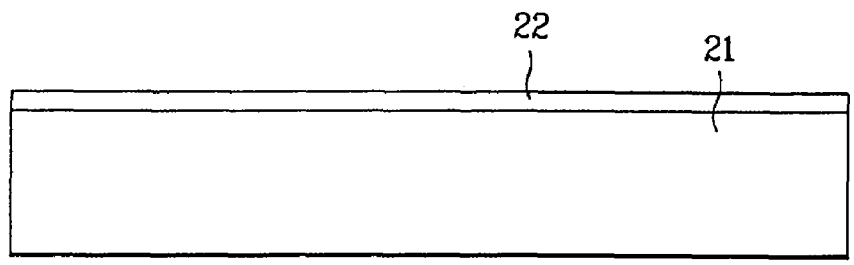
FIGS. 2A to 2D are cross-sectional diagrams for explaining a method of fabricating a high-voltage CMOS device according to the present invention.

FIG. 2A shows a step of forming a pad oxide layer on a substrate.

Referring to FIG. 2A, a pad oxide layer 22 is formed on a P type substrate 21 provided with a prescribed device. Preferably, the pad oxide layer 22 is formed by thermal oxidation. The pad oxide layer 22 is to prevent the substrate from being damaged by various kinds of the following steps or processes.

Figure 2B:
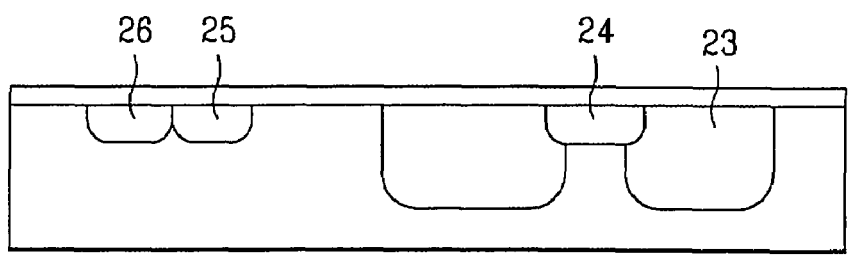

FIG. 2B shows a step of forming a photoresist pattern on the pad oxide layer and then forming a heavily doped drain region, a heavily doped source region, and an extended drain region failing to enclose the heavily doped drain region by ion implantation using the photoresist pattern.

Referring to FIG. 2B, a first pattern is formed on the substrate. A first ion implantation with N type impurity ions is carried out on the substrate to form an extended N type drain 23 using the first pattern. After the first pattern has been removed, a second pattern is formed on the pad oxide layer. A second ion implantation with N type impurity ions is carried out on the substrate to form a heavily doped N type drain 24 and a heavily doped N type source 25 using the second pattern. Subsequently, a third ion implantation with P type impurity ions is carried out on the substrate to form a P type source 26 using the third pattern. In doing so, each of the impurity ion types depends on the substrate type. If a P type substrate is used, an N type heavily doped drain, an N type heavily doped source, an N type extended drain, and a P type source are formed. If an N type substrate is used, a P type heavily doped drain, a P type heavily doped source, a P type extended drain, and an N type source are formed. In doing so, the N type extended drain is formed in the P type substrate not to enclose the N type heavily doped drain, whereby the N type heavily doped drain can directly meet the P type substrate that is lightly doped.

Figure 2C:
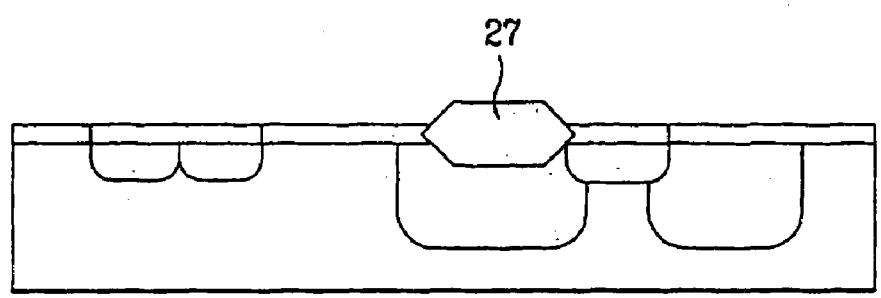

FIG. 2C shows a step of forming a field oxide layer on a prescribed area of the extended drain region.

Referring to FIG. 2C, a filed oxide layer 27 is formed on a prescribed area of the extended drain region. In doing so, the filed oxide layer is preferably formed by thermal oxidation. Specifically, a fourth pattern is formed over the substrate to open the prescribed area where the field oxide layer will be formed. And, the open area is oxidized by thermal oxidation to form the field oxide layer 27 for device isolation.

Figure 2D:
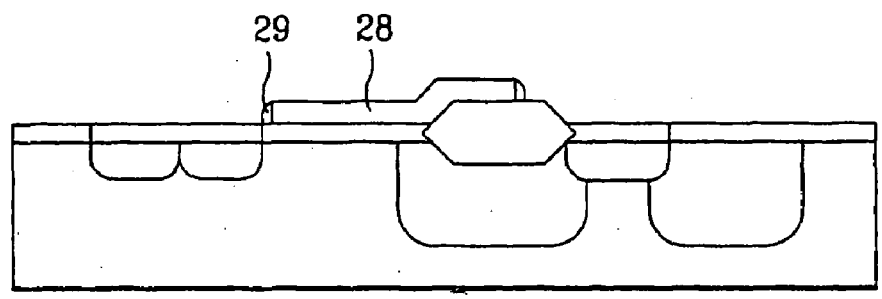

FIG. 2D shows a step of forming a gate and a gate spacer over the substrate.

Referring to FIG. 2D, a gate 28 and a sidewall spacer 29 protecting a sidewall of the gate 28 are formed to be overlapped with the source and drain regions.

Figure 2E:
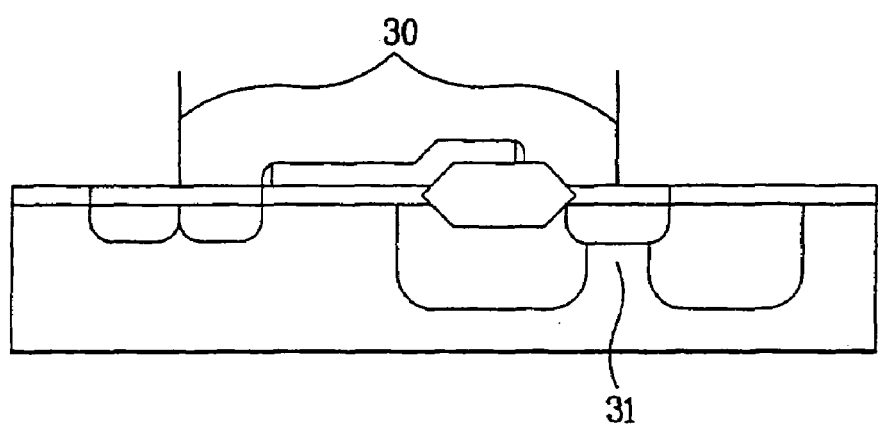

FIG. 2E shows a cross-sectional view of the substrate for explaining an operation of the high-voltage CMOS device having contacts provided to the source/drain.

Referring to FIG. 2E, the N type extended drain is formed in the P type substrate not to enclose the N type heavily doped drain, whereby the N type heavily doped drain can directly meet the P type substrate that is lightly doped. Hence, when a high voltage is applied o the N type drain via contacts 30 of the source/drain, an electric field concentration fails to occur on a semiconductor surface boundary between the lightly doped P type substrate and the lightly doped N type drain but intensively takes place at a junction 31 between the N type drain and a lower part of the lightly doped P type substrate. Hence, the high electric field concentration occurs not on a surface but within a bulk of the substrate to isolate the junction 31 from a high current flow path and to bring about breakdown in the bulk, whereby the device reliability can be enhanced.

Therefore, in a method of fabricating a high-voltage CMOS device according to the present invention, an extended drain region failing to enclose a heavily-doped drain region is separated from a high current flow path to enable high electric field concentration and breakdown to occur within a bulk of a silicon substrate, whereby device reliability can be enhanced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a high-voltage CMOS device, comprising the steps of:
   forming a pad oxide layer on a substrate;
   forming an extended drain region by ion implantation using a first pattern provided on the pad oxide layer;
   forming a heavily doped drain region and a heavily doped source region by ion implantation using a second pattern provided on the pad oxide layer, wherein the heavily doped drain region is not enclosed by the extended drain region;
   forming a source region by ion implantation using a third pattern provided on the pad oxide layer;
   forming a field oxide layer on a prescribed area of the extended drain region using a fourth pattern provided on the substrate; and
   forming a gate and a gate spacer over the substrate after forming the field oxide layer,
   wherein the extended drain region is formed between the heavily doped drain region and the substrate.

2. The method of claim 1, wherein if the substrate is a P type substrate, the heavily doped drain region, the heavily doped source region, and the extended drain region are doped with N type impurities and the source region is doped with P type impurities.

3. The method of claim 1, wherein if the substrate is an N type substrate, the heavily doped drain region, the heavily doped source region, and the extended drain region are doped with P type impurities and the source region is doped with N type impurities.

* * * * *